United States Patent
Park et al.

(10) Patent No.: US 9,491,870 B2
(45) Date of Patent: Nov. 8, 2016

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Sun Park, Yongin (KR); Chun-Gi You, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 586 days.

(21) Appl. No.: 13/797,601

(22) Filed: Mar. 12, 2013

(65) Prior Publication Data

US 2014/0140019 A1 May 22, 2014

(30) Foreign Application Priority Data

Nov. 16, 2012 (KR) ........................ 10-2012-0130515

(51) Int. Cl.
H05K 7/02 (2006.01)
H05K 3/36 (2006.01)
H05K 1/11 (2006.01)
H05K 3/32 (2006.01)
H01L 27/32 (2006.01)

(52) U.S. Cl.
CPC .......... *H05K 3/361* (2013.01); *H01L 27/3276* (2013.01); *H05K 1/113* (2013.01); *H05K 3/323* (2013.01); *H05K 2201/0108* (2013.01); *H05K 2201/09436* (2013.01); *H05K 2201/10128* (2013.01); *H05K 2201/10977* (2013.01); *Y10T 29/49117* (2015.01)

(58) Field of Classification Search
CPC .......... H05K 2201/09436; H05K 2201/10977
See application file for complete search history.

(56) References Cited

U.S. PATENT DOCUMENTS

| | | | |
|---|---|---|---|
| 7,247,881 B2 * | 7/2007 | Lee | ...................... H01L 27/3276 257/49 |
| 7,268,416 B2 | 9/2007 | Furihata | |
| 7,838,880 B2 | 11/2010 | Kwak et al. | |
| 2004/0080688 A1 * | 4/2004 | Ishida | .................... G02F 1/1345 349/113 |
| 2006/0202615 A1 * | 9/2006 | Murakami | ............ H01L 51/525 313/506 |
| 2007/0075313 A1 * | 4/2007 | Kwak | .................... H01L 27/124 257/59 |
| 2009/0168318 A1 * | 7/2009 | Moon | ................. H01L 51/5237 361/679.21 |

FOREIGN PATENT DOCUMENTS

| | | |
|---|---|---|
| KR | 10-2006-0017162 | 2/2006 |
| KR | 10-2006-0045922 | 5/2006 |
| KR | 10-2007-0036996 | 4/2007 |
| KR | 10-2012-0075147 | 7/2012 |

* cited by examiner

*Primary Examiner* — Carolyn R Edwards
(74) *Attorney, Agent, or Firm* — Lewis Roca Rothgerber Christie LLP

(57) ABSTRACT

A display apparatus for improving corrosion resistance of a pad area and a method of manufacturing the same. The display apparatus includes a first substrate including a display area, a non-display area, and a pad area, and a second substrate facing the first substrate and corresponding to at least the display area, wherein the pad area includes, a connection area connected to a driving circuit; an exposed area spaced from the connection area; and a plurality of blocking areas between the connection area and the exposed area.

21 Claims, 17 Drawing Sheets

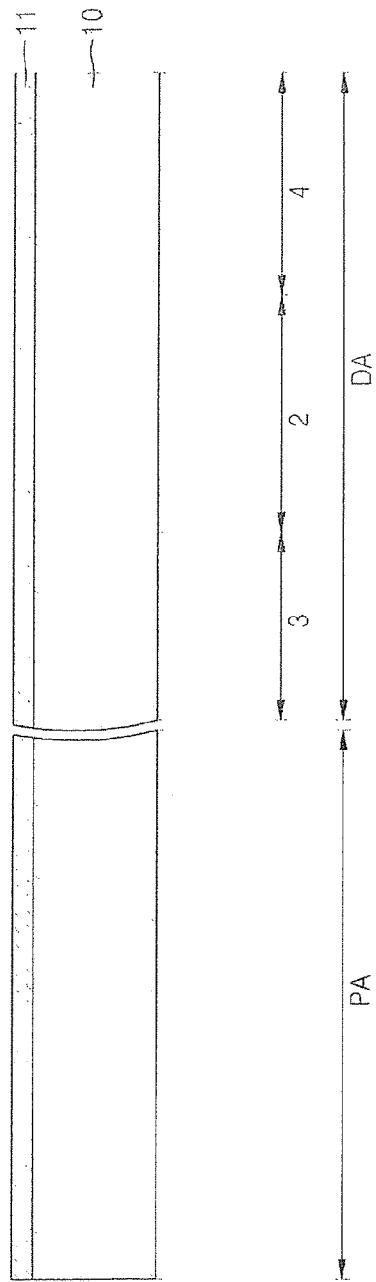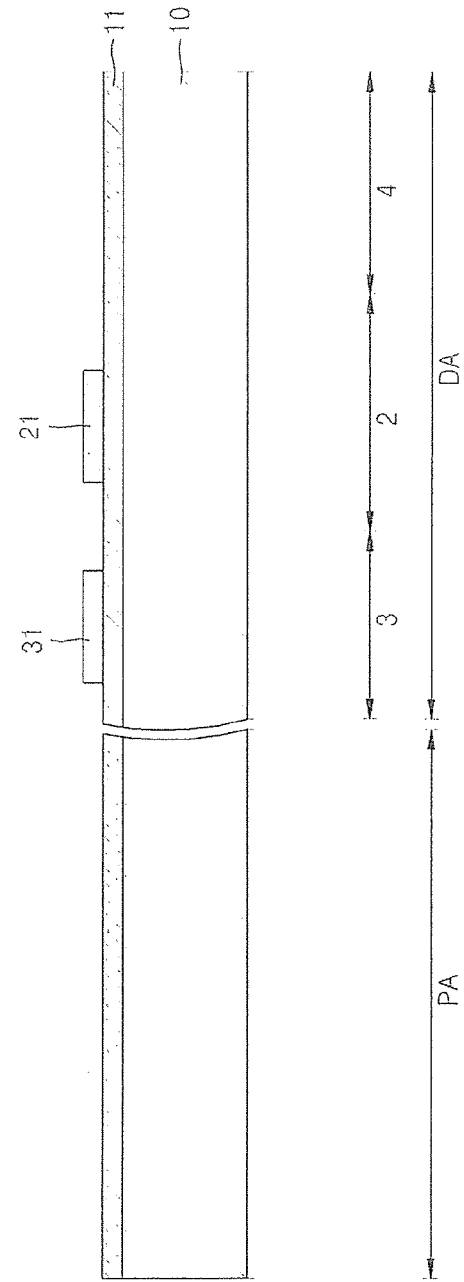

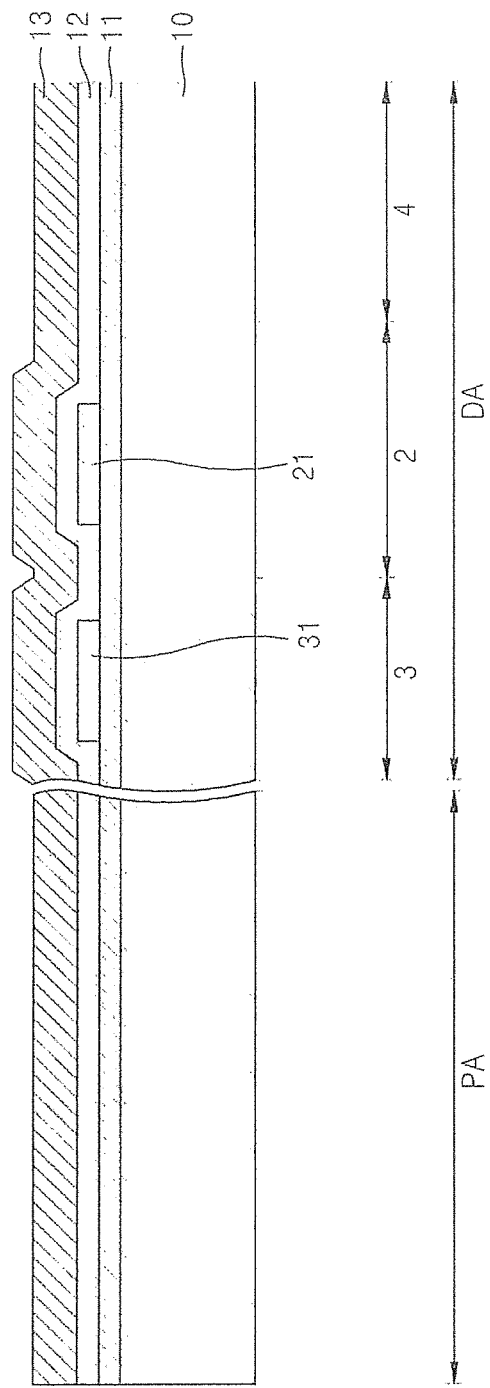

DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0130515, filed on Nov. 16, 2012, in the Korean Intellectual Property Office, the disclosure of which is incorporated herein in its entirety by reference.

BACKGROUND

1. Field

The present invention relates to a display apparatus and a method of manufacturing the same.

2. Description of the Related Art

In recent years, display apparatuses have been replacing portable thin flat plate display apparatuses. A display apparatus includes a driving circuit unit that generates an electrical signal and a pad unit that transmits the electrical signal generated by the driving circuit unit.

The pad unit includes a plurality of wiring lines and is located at an edge of the display apparatus, and thus the pad unit may be easily damaged due to external moisture. Additionally, the pad unit serves as a path through which moisture enters, and the moisture may subsequently enter a display area of the display apparatus. Accordingly, there are limitations to improving electrical characteristics of the display apparatus.

SUMMARY

Embodiments of the present invention provide a display apparatus with improved corrosion resistance and a method of manufacturing the display apparatus.

According to an aspect of the present invention, there is provided a display apparatus including a first substrate including a display area, a non-display area, and a pad area, and a second substrate facing the first substrate and corresponding to at least the display area, wherein the pad area includes, a connection area connected to a driving circuit; an exposed area spaced from the connection area; and a plurality of blocking areas between the connection area and the exposed area.

The display apparatus may further include a corrosion preventer at at least one of the plurality of blocking areas.

The plurality of blocking areas may include a first blocking area adjacent to the exposed area and a second blocking area adjacent to the connection area.

The display apparatus may further include a corrosion preventer at the first blocking area.

The driving circuit unit may include a flexible printed circuit (FPC) connected to the connection area and is bent toward the second substrate.

A top surface of the exposed area may be spaced from the FPC and not covered by the FPC.

The display apparatus may further include a printed circuit board (PCB) facing the second substrate and connected to the FPC.

The PCB may not cross an extension line of a side surface of the first substrate.

The connection area may be farther from an edge of the first substrate than the exposed area.

The display area may include a first electrode, a second electrode, and an intermediate layer between the first electrode and the second electrode and comprising an organic emission layer.

The display area may further include a thin film transistor (TFT) electrically connected to the first electrode and comprising an active layer, a gate electrode, and source and drain electrodes.

The connection area may have a multi-layered structure including a plurality of layers, wherein at least one of the plurality of layers includes a same material as the gate electrode, and at least another one of the plurality of layers includes a same material as the source and drain electrodes.

According to another aspect of the present invention, there is provided a display apparatus that includes a first substrate including a display area, a non-display area, and a pad area, and a second substrate facing the first substrate and corresponding to at least the display area, wherein the pad area includes: a connection area connected to a driving circuit unit; an exposed area spaced from the connection area; a single blocking area between the connection area and the exposed area; and a corrosion preventer at the single blocking area.

The driving circuit may include an FPC connected to the connection area and bent toward the second substrate.

A top surface of the exposed area may be spaced from the FPC and not covered by the FPC.

The display apparatus may further include a PCB facing the second substrate and connected to the FPC.

The PCB may not cross an extension line of a side surface of the first substrate.

The connection area may be farther from an edge of the first substrate than the exposed area.

The display area may include a first electrode, a second electrode, and an intermediate layer that between the first electrode and the second electrode and including an organic emission layer.

The display area may further include a TFT electrically connected to the first electrode and including an active layer, a gate electrode, and source and drain electrodes.

The connection area may have a multi-layered structure including a plurality of layers, wherein at least one of the plurality of layers includes a same material as the gate electrode, and at least another one of the plurality of layers includes a same material as the source and drain electrodes.

According to another aspect of the present invention, there is provided a method of manufacturing a display apparatus, the method including: preparing a first substrate including a display area, a non-display area, and a pad area, and a second substrate facing the first substrate and corresponding to at least the display area; forming a plurality of blocking areas between a connection area and an exposed area of the pad area; and connecting a driving circuit to the connection area.

In the forming of the plurality of blocking areas, a laser beam may be used.

In the forming of the plurality of blocking areas, a first blocking area and a second blocking area may be concurrently or sequentially formed.

The method may further include forming a corrosion preventer at at least one of the plurality of blocking areas.

In the connecting of the driving circuit to the connection area, an FPC may be connected, wherein one end of the FPC is connected to the connection area and the FPC is bent toward the second substrate.

In the connecting of the driving circuit to the connection area, a PCB may be connected to the FPC and face toward the second substrate.

The PCB may not cross an extension line of a side surface of the first substrate.

According to another aspect of the present invention, there is provided a method of manufacturing a display apparatus, the method including: preparing a first substrate including a display area, a non-display area, and a pad area, and a second substrate that facing the first substrate and corresponding to at least the display area; forming a single blocking area between a connection area and an exposed area of the pad area; forming a corrosion preventer at the single blocking area; and connecting a driving circuit unit to the connection area.

In the forming of the single blocking area, a laser beam may be used.

In the connecting of the driving circuit to the connection area, an FPC may be connected, wherein one end of the FPC is connected to the connection area and the FPC is bent toward the second substrate.

In the connecting of the driving circuit to the connection area, the PCB may be connected to the FPC and face toward the second substrate.

The PCB may not to cross an extension line of a side surface of the first substrate.

BRIEF DESCRIPTION OF THE DRAWINGS

The above and other features and aspects of the present invention will become more apparent by describing in detail exemplary embodiments thereof with reference to the attached drawings in which:

FIGS. 3A and 3B are enlarged views of portion 'A' shown in FIG. 1, wherein

FIG. 3A shows an example embodiment of a pad area and FIG. 3B shows another example embodiment of the pad area;

FIGS. 5A through 5I are schematic cross-sectional views showing common operations in a process of manufacturing the display apparatuses shown in FIGS. 4A and 4B;

DETAILED DESCRIPTION

Figure 1:
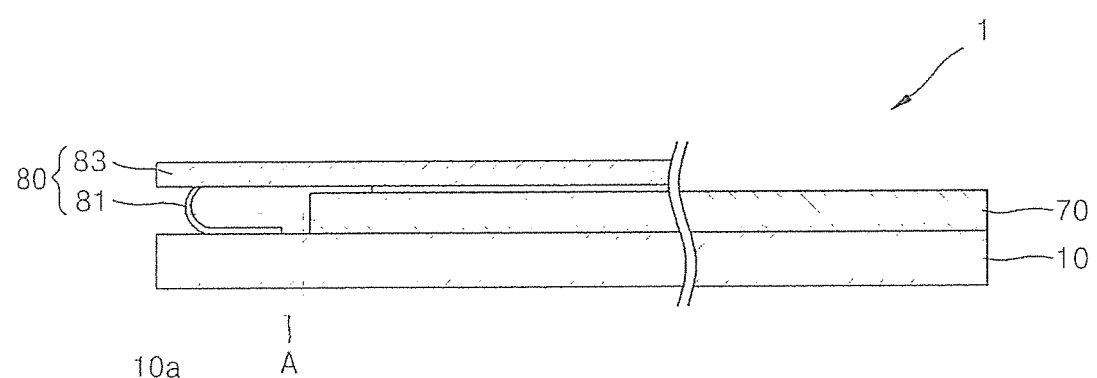
FIG. 1 is a schematic cross-sectional view showing a display apparatus, according to an embodiment of the present invention.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity. Like reference numerals denote like elements throughout the specification. As used herein, the term "and/or" includes any and all combinations of one or more of the associated listed items. Expressions such as "at least one of," when preceding a list of elements, modify the entire list of elements and do not modify the individual elements of the list.

Figure 2A:
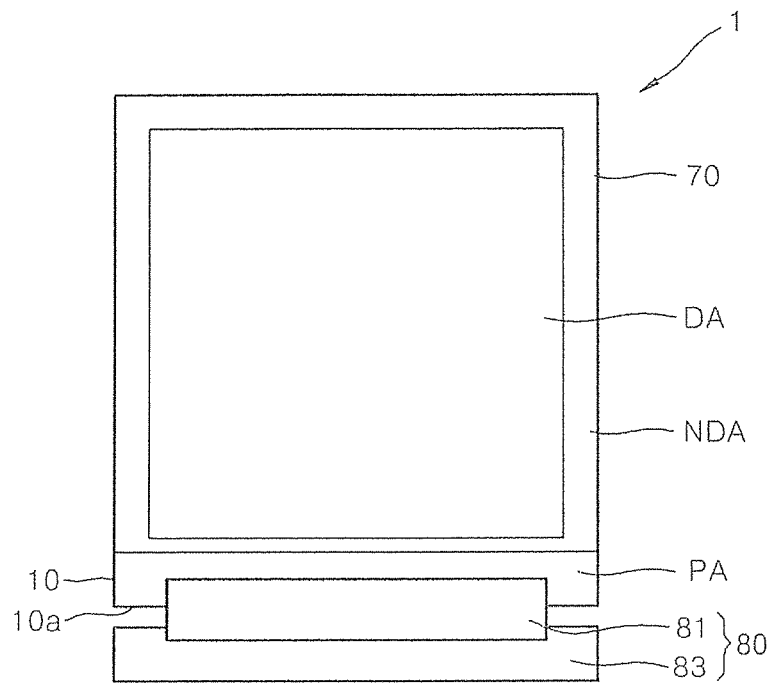
FIGS. 2A and 2B are schematic plan views showing a configuration of the display apparatus shown in FIG. 1.
Figure 2B:
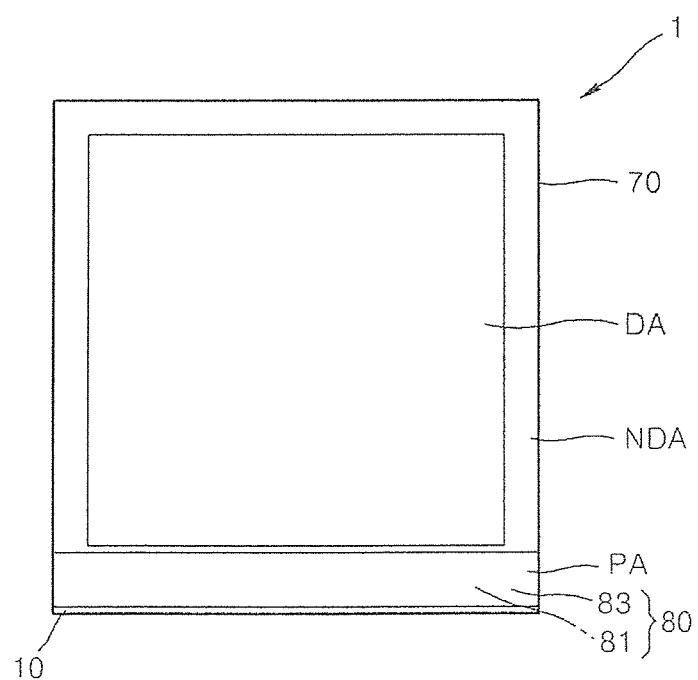

FIG. 1 is a schematic cross-sectional view showing a display apparatus 1, according to an embodiment of the present invention. FIGS. 2A and 2B are schematic plan views showing a configuration of the display apparatus 1 shown in FIG. 1.

Referring to FIGS. 1, 2A, and 2B, the display apparatus 1 may include a first substrate 10, a second substrate 70 that is coupled (or attached) to the first substrate 10 by sealing, and a driving circuit (or driving circuit unit) 80.

The first substrate 10 may be formed of a $SiO_2$-based transparent glass material. However, the present invention is not limited thereto, and the first substrate 10 may be formed of a transparent plastic material or any other suitable material. The plastic material may be one or more materials selected from various organic materials.

The first substrate 10 includes a display area DA on which an image is displayed, a non-display area NDA that is located outside of (or surrounding) the display area DA, and a pad area PA that is located at at least one side of the non-display area NDA. The display area DA may include various components or regions such as an emission area, a transistor area, and the like, which will be described below in detail.

The second substrate 70 is arranged (or disposed) to face the first substrate 10 and may seal at least the display area DA. The emission area, the transistor area, and the like that are included in the display area DA may be blocked from external moisture, external air, or the like. The second substrate 70 may be a glass substrate, a plastic substrate, or a stainless using steel (SUS) substrate.

The pad area PA transmits an electrical signal generated by the driving circuit 80 to the display area DA. The driving circuit 80 includes a flexible printed circuit (FPC) 81 and a printed circuit board (PCB) 83. The FPC 81 is located (or disposed) between the pad area PA and the PCB 83 and electrically connects the pad area PA and the PCB 83 to each other. The PCB 83 has various circuit patterns, and may supply power or generate various signals for driving the display apparatus 1. The electrical signals generated by the PCB 83 are transmitted to the pad area PA via the FPC 81 and are then transmitted to the display area DA to drive the display area DA.

The FPC 81 positioned (or disposed) between the pad area PA and the PCB 83 is bent or folded, as shown in FIG. 1. In other words, as shown in FIG. 2A, the first substrate 10, the FPC 81, and the PCB 83 are sequentially connected, and then the FPC 81 is folded (e.g., bent or curved) such that the PCB 83 faces the second substrate 70, as shown in FIG. 2B. Although FIG. 1 shows that the PCB 83 and the second substrate 70 adhere to each other using a separate member such as a junction layer, the present invention is not limited thereto. Moreover, the separate member is not limited to being located (or disposed) between the PCB 83 and the second substrate 70.

The FPC 81 may be bent (or folded) in a direction away from a side surface of the first substrate 10 so that the side surface of the first substrate 10 may be externally exposed without being covered by the FPC 81. Here, the FPC 81 may be arranged or positioned so as not to cross an extension line 10a extending from the edge (or side surface) of the first substrate 10. The PCB 83 connected to the FPC 81 may be positioned so as not to extend beyond the extension line 10a of the edge (or side surface) of the first substrate 10. In other words, when the FPC 81 and the PCB 83 are formed and positioned so as not to cross an edge of the first substrate 10, the width of the display apparatus 1 may be minimized (or reduced) while maintaining the size of the display area DA of the display apparatus 1.

Figure 3A:
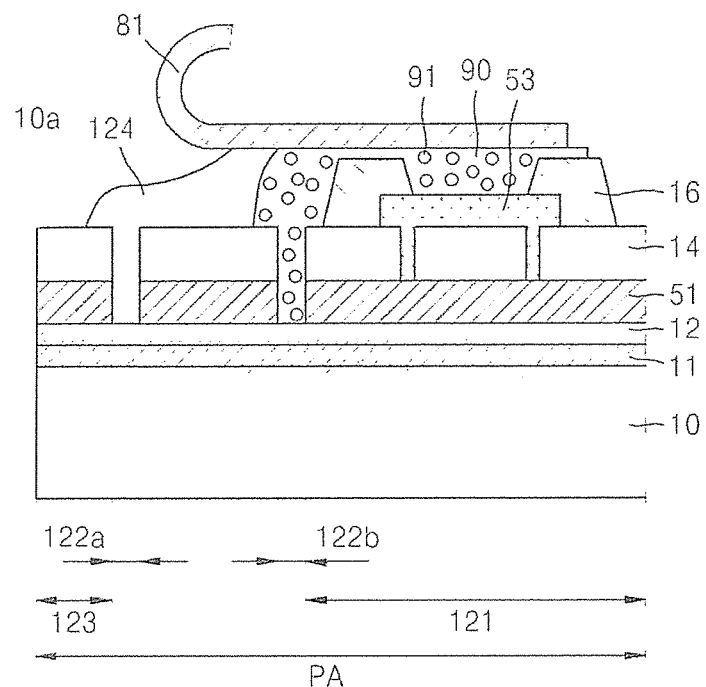
Figure 3B:
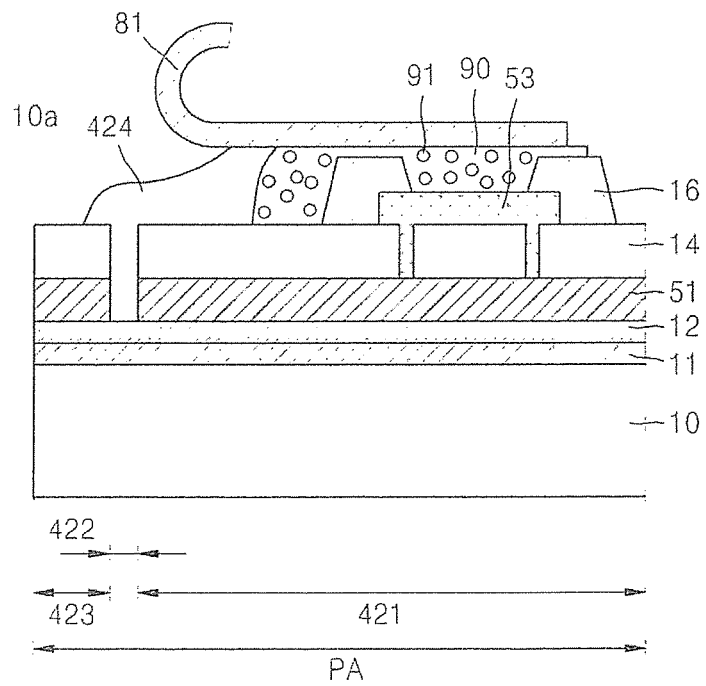

FIGS. 3A and 3B are enlarged views of portion 'A' shown in FIG. 1, wherein FIG. 3A shows an example embodiment of the pad area PA, and FIG. 3B shows another example embodiment of the pad area PA.

As an example, the pad area PA may include a connection area 121, an exposed area 123, and a plurality of blocking areas 122a and 122b as shown in FIG. 3A.

The connection area 121 is an area that contacts the FPC 81. A signal generated by the PCB 83 (see FIG. 1) is transmitted to the display area DA via the FPC 81. A side surface of the exposed area 123 is externally exposed. Also, the FPC 81 is bent (or folded), and thus a top surface of the exposed area 123 is externally exposed. As such, corrosion may occur in the exposed area 123, which is exposed to the outside, due to moisture, and the exposed area 123 may be a path through which corrosion spreads.

The blocking areas 122a and 122b are areas that block connection between the exposed area 123 and the connection area 121, and separate the exposed area 123 and the connection area 121 from each other. The blocking areas 122a and 122b may be formed to have an opening shape. A plurality of blocking areas 122a and 122b may be formed of, for example, a first blocking area 122a and a second blocking area 122b. The first blocking area 122a may be adjacent to the exposed area 123, and the second blocking area 122b may be adjacent to the connection area 121.

Moisture having penetrated to the exposed area 123 and corrosion having occurred due to the moisture may be primarily blocked by the first blocking area 122a and may be secondarily blocked by the second blocking area 122b. In addition, even though bubbles may be generated between the first blocking area 122a and the second blocking area 122b during a process of connecting the FPC 81 with the connection area 121, corrosion due to the bubbles may be prevented from spreading by the second blocking area 122b.

A width of each of the first blocking area 122a and the second blocking area 122b may be in a range of about 30 µm to about 200 µm. If widths of the blocking areas 122a and 122b are less than 30 µm, moisture penetrating through the exposed area 123 may move to the connection area 121. If the widths of the blocking areas 122a and 122b exceed 200 µm, a width of the display apparatus 1 may be enlarged. The width is a length in a horizontal direction of FIG. 3A.

The exposed area 123 is not covered by the FPC 81 and is spaced apart from the FPC 81. A width of the exposed area 123 may be equal to or greater than 400 µm. If the width of the exposed area 123 is less than 400 µm, the connection area 121 of the pad area PA may be damaged when cutting off the first substrate 10 during a manufacturing process of the display apparatus 1.

In another embodiment of the present invention, the pad area PA may include a connection area 421, an exposed area 423, a single blocking area 422, and a corrosion preventer (or corrosion prevention unit) 424, as shown in FIG. 3B.

The blocking area 422 is an area that blocks connection between the exposed area 423 and the connection area 421 and separates the exposed area 423 and the connection area 421 from each other. The blocking area 422 may be formed to have an opening shape. The blocking area 422 may be positioned to be closer to an edge of a substrate than a bent or folded area of the FPC 81 so that a top portion of the blocking area 422 is not covered by the FPC 81.

At least a part of the corrosion preventer 424 may be formed inside (or within) the blocking area 422. When the corrosion preventer 424 is formed in the blocking area 422, moisture penetrating along a side surface of the exposed area 423 may be further prevented from spreading to the connection area 421. Also, moisture may be prevented from penetrating through the blocking area 422. A material of the corrosion preventer 424 may be silicon or the like. However, the present invention is not limited thereto.

In FIG. 3A, the corrosion preventer 124 may be formed in at least one of the plurality of blocking areas 122a or 122b, as shown in FIG. 3A. For example, the corrosion preventer 124 may be formed in the first blocking area 122a. When the corrosion preventer 124 is formed in the first blocking area 122a, moisture penetrating along the side surface of the exposed area 123 may be further firmly prevented from spreading to the connection area 121.

Figure 4A:
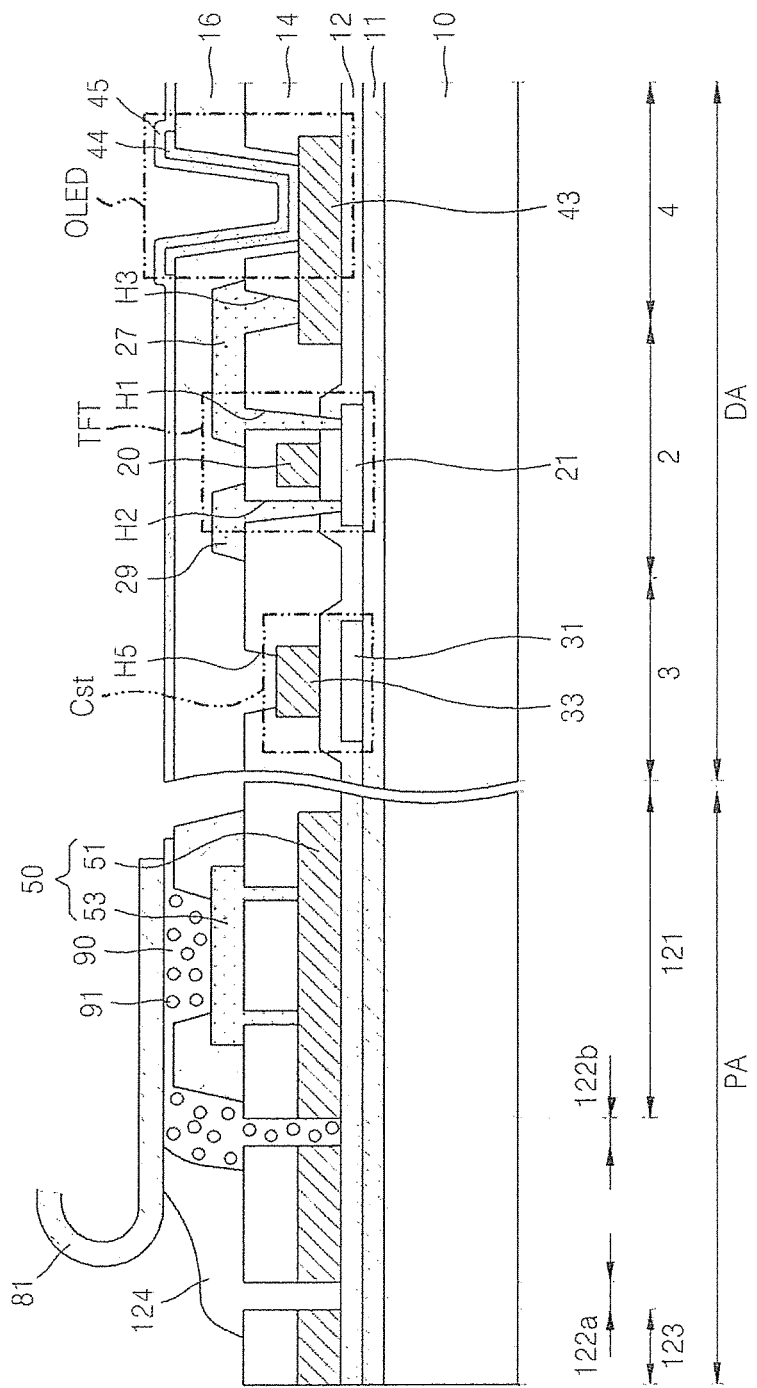
FIG. 4A is a schematic cross-sectional view showing a display apparatus including the pad area shown in FIG. 3A.
Figure 4B:
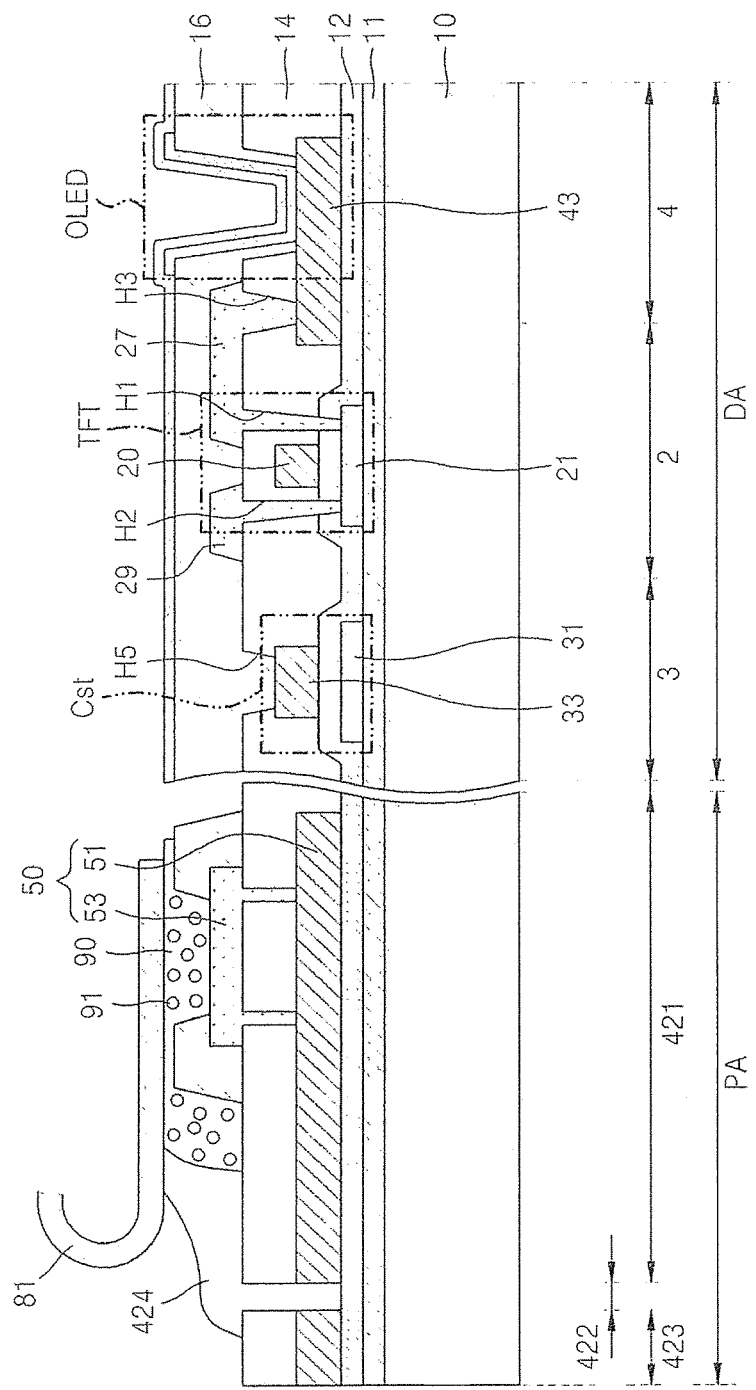
FIG. 4B is a schematic cross-sectional view showing a display apparatus including the pad area shown in FIG. 3B.

FIG. 4A is a schematic cross-sectional view showing the display apparatus 1 including the pad area PA shown in FIG. 3A. FIG. 4B is a schematic cross-sectional view showing the display apparatus 1 including the pad area PA shown in FIG. 3B.

Referring to FIGS. 4A and 4B, the display area DA of the display apparatus 1 may include a transistor area 2 and an emission area 4. The display area DA may further include a storage area 3. Also, the pad area PA may include the connection area 121 or 421, the exposed area 123 or 423, and the blocking areas 122a and 122b, or the blocking area 422.

The transistor area 2 may include a thin film transistor TFT as a driving device. The TFT may include an active layer 21, a gate electrode 20, and source and drain electrodes 29 and 27. The gate electrode 20 may include any one of gold (Au), silver (Ag), copper (Cu), nickel (Ni), platinum (Pt), palladium (Pd), aluminum (Al), and molybdenum (Mo), or a combination thereof, but the present invention is not limited thereto. Thus, the gate electrode 20 may be formed of any suitable one of various materials in consideration of adhesion with respect to an adjacent layer, flatness, electrical resistance, and processability. A first insulating layer 12, which is a gate insulating film, may be interposed between the gate electrode 20 and the active layer 21 to insulate the gate electrode 20 and the active layer 21 from each other. A second insulating layer 14, which is an insulating interlayer, may be formed on the gate electrode 20. The first insulating layer 12 and the second insulating layer 14 may be formed to expose source and drain regions of the active layer 21. The source and drain electrodes 29 and 27 may be formed to contact the source and drain regions of the active layer 21. The source and drain electrodes 29 and 27 may be formed using any of various conductive materials and may be formed to have a single- or multi-layered structure.

The storage area 3 may include a capacitor Cst. The capacitor Cst may include a capacitor lower electrode 31 and a capacitor upper electrode 33, and the first insulating layer 12 may be interposed between the capacitor lower electrode 31 and the capacitor upper electrode 33. Here, the capacitor lower electrode 31 may be formed of the same material as the active layer 21 of the TFT. The capacitor lower electrode 31 may be formed of a semiconductor material and may be doped with impurity substances, and thus may have an improved electrical conductivity. Meanwhile, the capacitor upper electrode 33 may be formed of the same material as the gate electrode 20 of the TFT and a first electrode 43 of an organic light-emitting diode (OLED).

The emission area 4 may include a light-emitting device, for example, an OLED. The OLED may include the first electrode 43 connected to one of the source and drain electrodes 29 and 27 of the TFT, a second electrode 45 formed to face the first electrode 43, and an intermediate layer 44 interposed between the first electrode 43 and the second electrode 45. The first electrode 43 may be formed of the same material as the gate electrode 20 of the TFT.

The connection areas 121 and 421 of the pad area PA may include a pad electrode 50. Although not shown in the drawing, the pad electrode 50 may be electrically connected to the TFT or the light-emitting device via a wiring line (not shown). The pad electrode 50 may be electrically connected to the FPC 81. Accordingly, the pad electrode 50 may transmit current applied via the FPC 81 to the TFT or the OLED that is located in the display area DA via the wiring line (not shown). The pad electrode 50 may include a first pad electrode 51 formed on the first insulating layer 12, and a second pad electrode 53 that is formed on the second insulating layer 14, which is an insulating interlayer, and of which at least a part is electrically connected to the first pad electrode 51. The first pad electrode 51 may be formed of the same material as the gate electrode 20, and the second pad electrode 53 may be formed of the same material as the source and drain electrodes 29 and 27.

The second pad electrode 53 may be externally exposed via an opening so as to be electrically connected to the driving circuit 80 located externally to the first substrate 10. The first pad electrode 51 may be covered by the second insulating layer 14 so as to be electrically connected to the second pad electrode 53 and insulated from other components. In other words, a top surface of the first pad electrode 51 is covered by the second insulating layer 14, which is an insulating interlayer, and thus is not externally exposed. The top surface of the second pad electrode 53 may be electrically connected to the driving circuit 80 using a conductive member 90, for example, an anisotropic conductive film (ACF) including a plurality of conductive balls 91.

Connection between the first pad electrode 51 and the second insulating layer 14 that are formed in the exposed areas 123 and 423 and the connection areas 121 and 421 is prevented by the blocking areas 122a, 122b, and 422. In other words, the blocking areas 122a, 122b, and 422 prevent the first pad electrode 51 and the second insulating layer 14 of the connection areas 121 and 421 from being connected to the first pad electrode 51 and the second insulating layer 14 of the exposed areas 123 and 423.

There are a plurality of the blocking areas 122a and 122b as shown in FIG. 4A. The plurality of blocking areas 122a and 122b may prevent connection between the exposed area 123 and the connection area 121 by the number of the blocking areas 122a and 122b. In addition, by forming the plurality of blocking areas 122a and 122b in the pad area PA, even though a gap is generated in any one blocking area 122a among the plurality of blocking areas 122a and 122b, penetration of moisture or spreading of corrosion through another blocking area 122b may be prevented.

Also, the corrosion preventer 124 may be formed in at least one of the plurality of blocking areas 122a and 122b. For example, the corrosion preventer 124 may be formed in the first blocking area 122a adjacent to the exposed area 123. When the corrosion preventer 124 is formed in the first blocking area 122a, moisture may be prevented from penetrating through the first blocking area 122a. Therefore, moisture having penetrated the exposed area 123 may be prevented from spreading toward the connection area 121. In addition, the corrosion prevention unit 124 may be formed to extend to the FPC 81 so as to prevent moisture from entering between the FPC 81 and the second insulating layer 14. In this case, the corrosion preventer 424 may be formed inside (or within) the blocking area 422 in order to prevent moisture from penetrating the blocking area 422. When the corrosion preventer 424 is formed in the blocking area 422, moisture penetrating along the side surface of the exposed area 423 may be further firmly prevented from spreading to the connection area 421. Also, penetration of moisture or spreading of corrosion through the blocking area 422 may be prevented. A material of the corrosion preventer 424 may be silicon or the like. However, the present invention is not limited thereto. At this time, the blocking area 422 may be positioned to be closer to the edge of the substrate than the bent area of the FPC 81 so that the top portion of the blocking area 422 is not covered by the FPC 81.

FIGS. 5A through 5I are schematic cross-sectional views showing common operations in a process of manufacturing the display apparatus 1 shown in FIGS. 4A and 4B. Hereinafter, common operations in the process of manufacturing the display apparatus 1 shown in FIGS. 4A and 4B will be schematically described.

First, as shown in FIG. 5A, an auxiliary layer 11 is formed on the first substrate 10. In detail, the first substrate 10 may be formed of a $SiO_2$-based transparent glass material. However, the present invention is not limited thereto, and the first substrate 10 may be formed of a transparent plastic material or any other suitable material.

Here, the auxiliary layer 11, such as a barrier layer, a blocking layer, and/or a buffer layer, may be formed on the first substrate 10 so as to prevent impurity ions from being diffused, to prevent penetration of moisture or external air, and to planarize a surface. The auxiliary layer 11 may be formed of $SiO_2$ and/or $SiN_x$ using any suitable one (or ones) of various deposition methods such as plasma enhanced chemical vapor deposition (PECVD), atmospheric pressure CVD (APCVD), or low pressure CVD (LPCVD).

Next, as shown in FIG. 5B, the active layer 21 and the capacitor lower electrode 31 of the TFT may be formed on the auxiliary layer 11. In detail, an amorphous silicon layer (not shown) is deposited on the auxiliary layer 11, and then the amorphous silicon layer is crystallized, thereby forming a polycrystalline silicon layer (not shown). The amorphous silicon layer may be crystallized by using any of various methods, for example, a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The sequential lateral solidification is patterned into the active layer 21 and the capacitor lower electrode 31 through a mask process using a first mask (not shown).

In the current embodiment, although the active layer 21 and the capacitor lower electrode 31 are separated from each other, the active layer 21 and the capacitor lower electrode 31 may be integrally formed.

Next, as shown in FIG. 5C, the first insulating layer 12 and a first conductive layer 13 are sequentially formed on the entire surface of the first substrate 10 in which the active layer 21 and the capacitor lower electrode 31 are formed.

The first insulating layer 12 may be formed by depositing an inorganic insulating layer such as SiNx or SiOx by using, for example, a PECVD method, a PCVD method, or an LPCVD method. The first insulating layer 12 is interposed between the active layer 21 and the gate electrode 20 of the TFT to serve as a gate insulating layer of the TFT and is interposed between the capacitor upper electrode 33 and the capacitor lower electrode 31 to serve as a dielectric layer of the capacitor Cst.

The first conductive layer 13 may include Au, Ag, Cu, Ni, Pt, Pd, Al, Mo, or an alloy, such as aluminum-neodymium (Al:Nd) or molybdenum-tungsten (Mo:W). However, the present invention is not limited thereto, and the first conductive layer 13 may be formed of any of various materials in consideration of adhesion with respect to an adjacent layer, flatness, electrical resistance, and processability. Thereafter, the first conductive layer 13 may be patterned into the first electrode 43, the gate electrode 20, the capacitor upper electrode 33, and the first pad electrode 51.

Figure 5D:
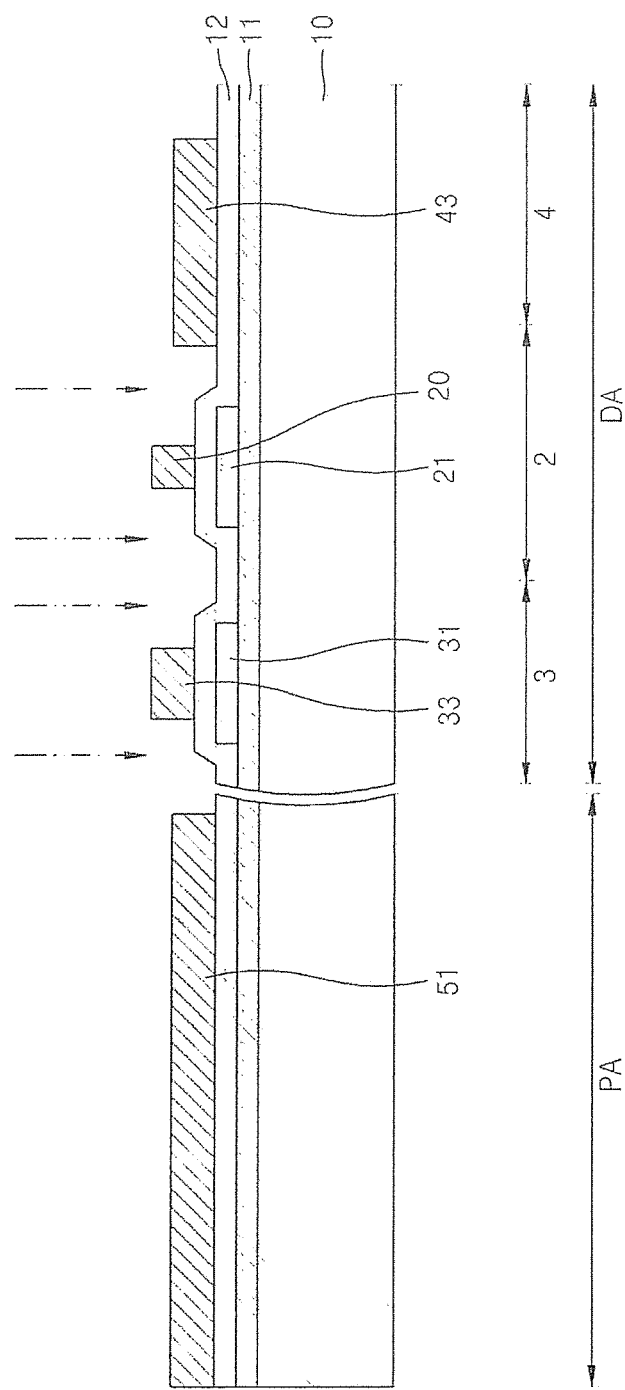

Next, as shown in FIG. 5D, the gate electrode 20, the first electrode 43, the capacitor upper electrode 33, and the first pad electrode 51 are formed on the first substrate 10.

In detail, the first conductive layer 13 formed on the entire surface of the first substrate 10 is patterned through a mask process using a second mask (not shown).

At this time, the gate electrode 20 is formed above the active layer 21 in the transistor area 2. The gate electrode 20 is formed as a part of the first conductive layer 13. Here, the gate electrode 20 may be formed to correspond to (or to be aligned with) a central portion of the active layer 21.

The capacitor upper electrode 33 is formed above the capacitor lower electrode 31 in the storage area 3, and the first electrode 43 is formed in the emission area 4. Then, the first pad electrode 51 for forming the pad electrode 50 later is formed at the pad area PA.

Figure 5E:
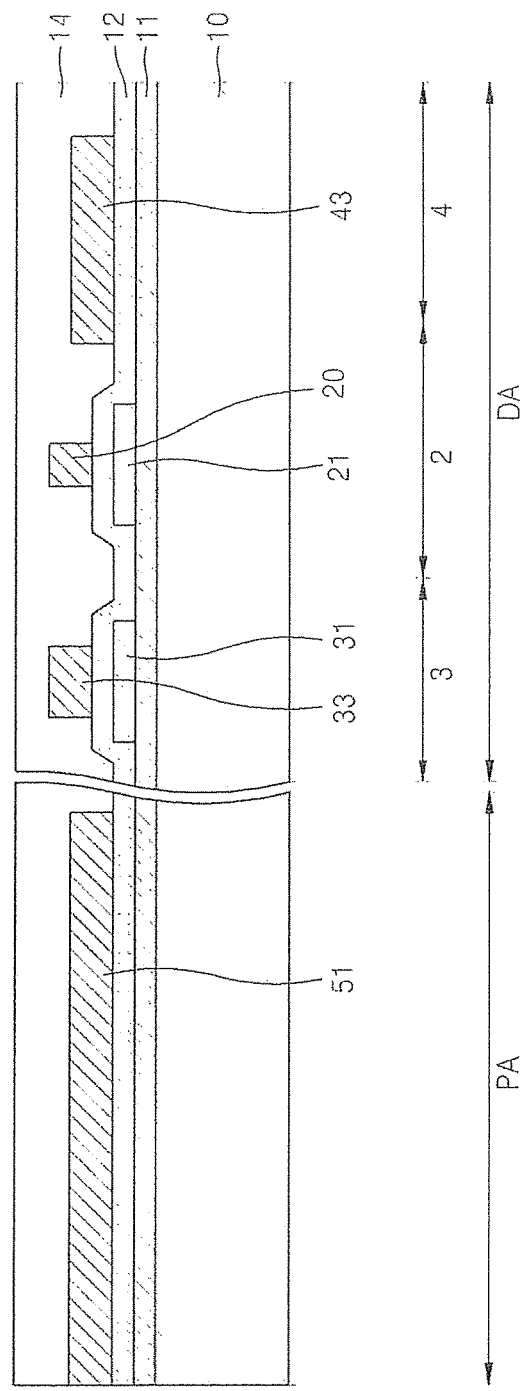

Next, as shown in FIG. 5E, the second insulating layer 14 is deposited on the entire surface of the first substrate 10 in which the gate electrode 20 is formed.

The second insulating layer 14 may be formed of at least one organic insulating material selected from the group consisting of polyimide, polyamide, an acryl resin, benzocyclobutene, and a phenol resin by spin coating or the like. The second insulating layer 14 may be formed to have a sufficient thickness, for example, formed thicker than the first insulating layer 12 described above to serve as an insulating interlayer between the gate electrode 20 and the source and drain electrodes 29 and 27 of the TFT. Meanwhile, the second insulating layer 14 may be formed of not only an organic insulating material but also an inorganic insulating material, much like the first insulating layer 12 described above, and may be formed by alternating an organic insulating material and an inorganic insulating material.

Figure 5F:
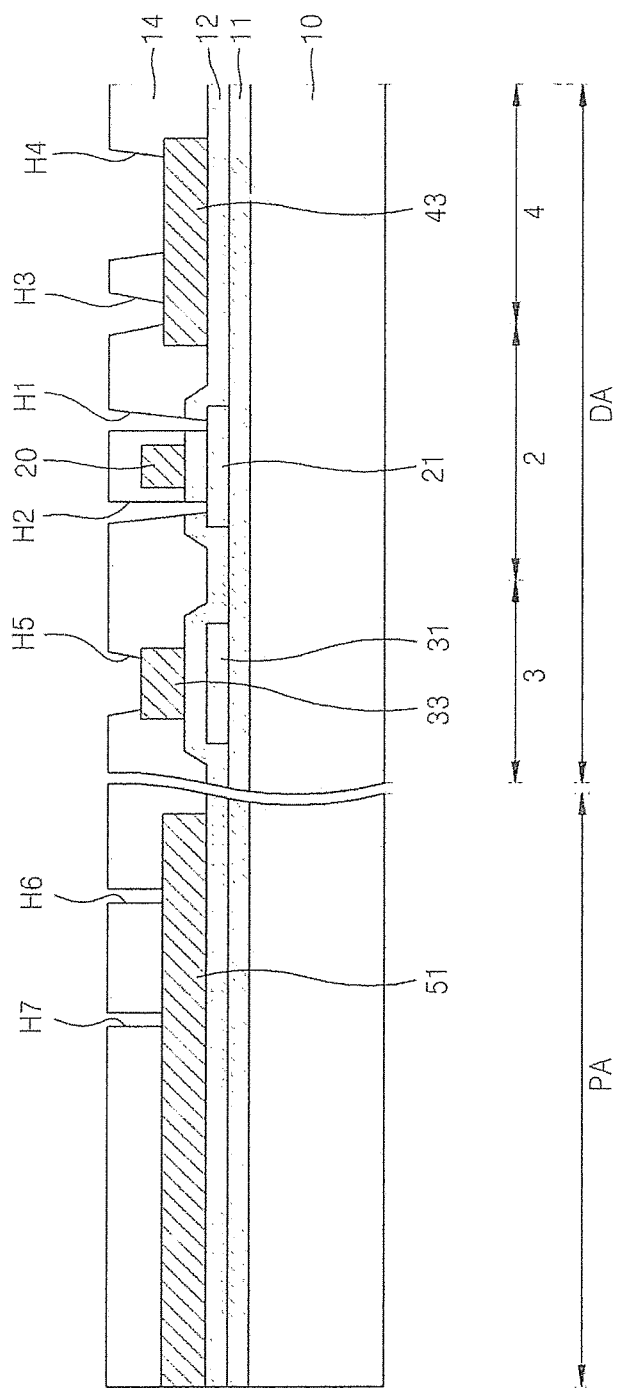

Next, as shown in FIG. 5F, the second insulating layer 14 is patterned to form third, fourth, and fifth openings H3, H4, and H5, exposing the capacitor upper electrode 33 and the first electrode 43. Contact holes H1 and H2 are formed as well, exposing the source and drain regions of the active layer 21. Additionally, sixth and seventh openings H6 and H7 are formed, exposing the first pad electrode 51.

Specifically, the second insulating layer 14 is patterned through a mask process using a third mask (not shown) to form the contact holes H1 and H2 and the third to seventh openings H3 to H7. Here, each of the contact holes H1 and H2 exposes a part of the active layer 21, and each of the third opening H3 and the fourth opening H4 exposes at least a part of the first electrode 43. The fifth opening H5 exposes at least a part of the capacitor upper electrode 33. Each of the sixth opening H6 and the seventh opening H7 exposes at least a part of the first pad electrode 51.

Figure 5G:
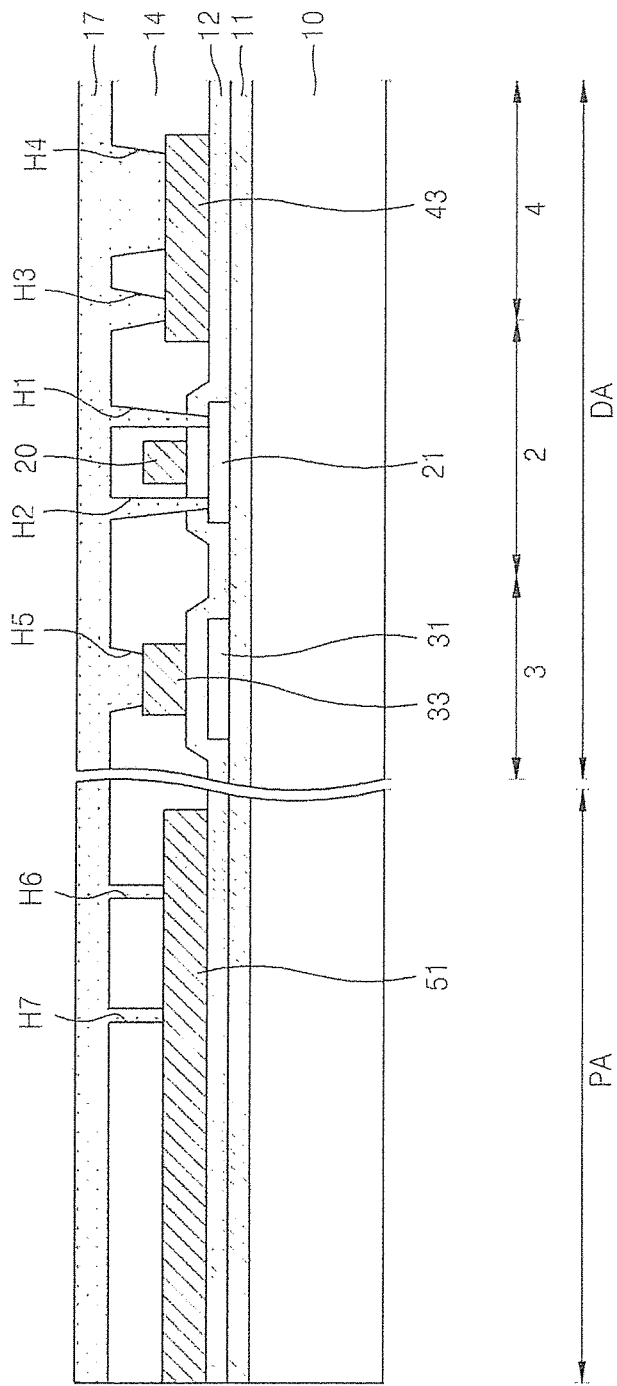

Next, as shown in FIG. 5G, a second conductive layer 17 is deposited on the entire surface of the first substrate 10 so as to cover the second insulating layer 14.

The second conductive layer 17 may be formed of the same conductive material as that of the first conductive layer 13 described above. However, the present invention is not limited thereto, and the second conductive layer 17 may be formed of any of various other conductive materials. Also, the conductive material is deposited to have a thickness sufficient to fill gaps between the contact holes H1 and H2 and the openings H3, H4, H5, H6, and H7 described above.

Figure 5H:
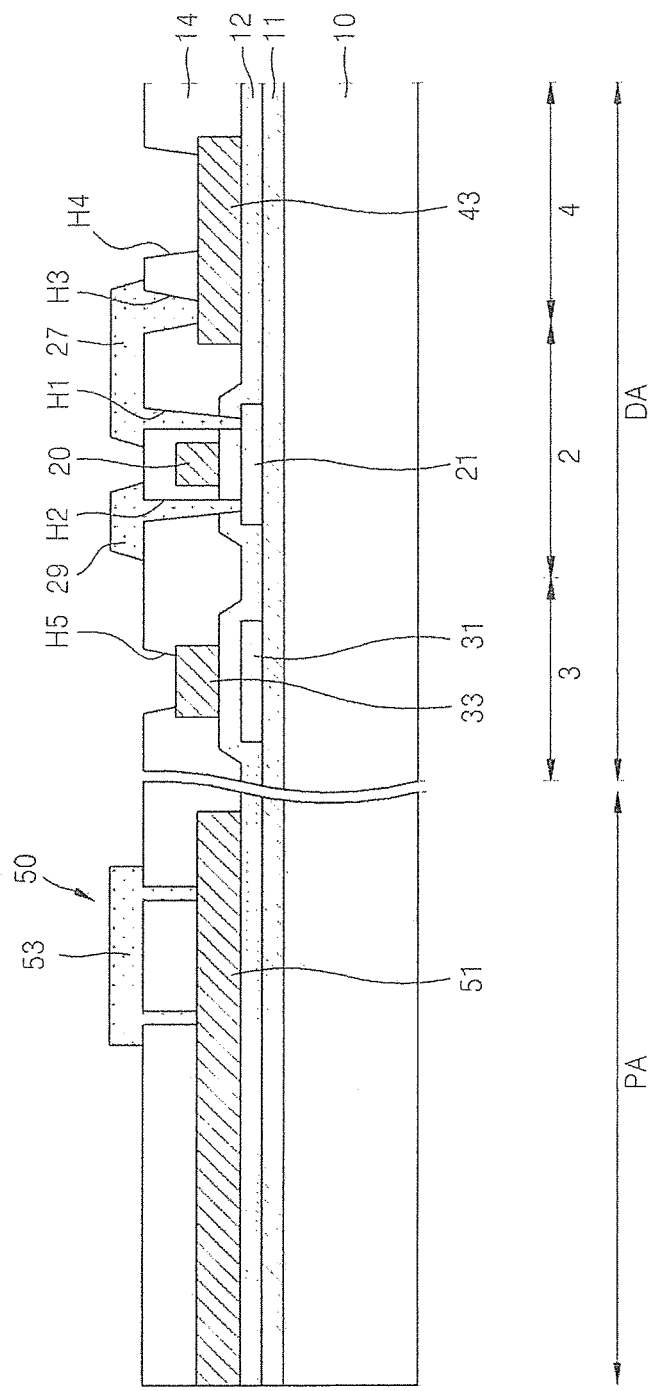

Next, as shown in FIG. 5H, the second conductive layer 17 (see FIG. 5G) is patterned to form the source and drain electrodes 29 and 27 and the second pad electrode 53.

In detail, the second conductive layer 17 (see FIG. 5G) may be patterned through a mask process using a fourth mask (not shown) to form the source and drain electrodes 29 and 27 and the second pad electrode 53.

Here, any one of the source and drain electrodes 29 and 27 (the drain electrode 27 in the current embodiment) may be formed to be connected to the first electrode 43 via the third opening H3 formed at an edge area of the first electrode 43.

Here, the second pad electrode 53 may be formed at the same time as the source and drain electrodes 29 and 27 are formed. However, the present invention is not limited thereto, and the second pad electrode 53 may be formed through an additional etching process after forming the source and drain electrodes 29 and 27.

Figure 5I:
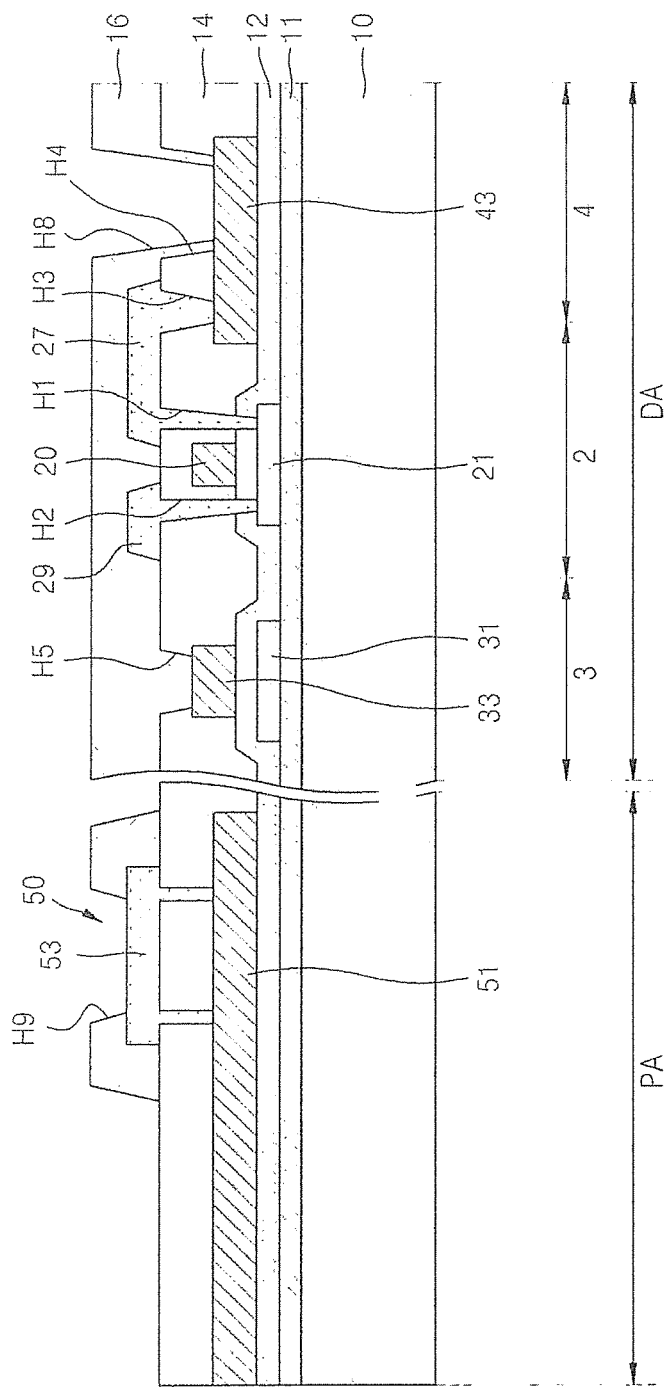

Next, as shown in FIG. 5I, a pixel define layer (PDL) 16 may be formed above the first substrate 10.

In detail, the third insulating layer 16 is deposited on the entire surface of the first substrate 10 in which the first electrode 43, the source and drain electrodes 29 and 27, the capacitor upper electrode 33, and the pad electrode 51 are formed. At this time, the third insulating layer 16 may be formed of at least one organic insulating material selected from the group consisting of polyimide, polyamide, an acryl resin, benzocyclobutene, and a phenol resin by spin coating or the like. Meanwhile, the third insulating layer 16 may be formed of not only an organic insulating material but also an inorganic insulating material selected from the group consisting of $SiO_2$, $SiN_X$, $Al_2O_3$, $CuO_x$, $Tb_4O_7$, $Y_2O_3$, $Nb_2O_5$, $Pr_2O_3$ and the like. Also, the third insulating layer 16 may be formed to have a multi-layered structure in which an organic insulating material and an inorganic insulating material are alternately formed.

The third insulating layer 16 may be patterned through a mask process using a fifth mask (not shown) to form an eighth opening H8 so as to expose a central portion of the first electrode 43, thereby defining a pixel. Also, the third insulating layer 16 may be patterned through a mask process using the fifth mask to form a ninth opening H9 so as to expose the second pad electrode 53. A detailed method of manufacturing the pad area PA will be described below with reference to FIGS. 6A to 6D and FIGS. 7A to 7D.

Thereafter, as shown in FIGS. 4A and 4B, the intermediate layer 44 and the second electrode 45 that include an emission layer are formed in the eighth opening H8 exposing the first electrode 43.

The intermediate layer 44 may include an organic emissive layer (EML) and at least one of functional layers such as a hole transport layer (HTL), a hole injection layer (HIL), an electron transport layer (ETL), and an electron injection layer (EIL). The intermediate layer 44 may be formed to be a single-layered structure or a multi-layered structure.

The organic emission layer may be formed of a low or high molecular material.

When the organic emission layer is formed of a low molecular material, the intermediate layer 44 may include a hole transport layer and a hole injection layer that are stacked around the organic emission layer toward the first electrode 43, and may include an electron transport layer and an electron injection layer that are stacked around the organic emission layer toward the second electrode 45. Likewise, various other layers may be stacked as required. At this time, examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

On the other hand, when the organic emission layer is formed of a high molecular material, the intermediate layer 44 may include only a hole transport layer around the organic emission layer toward the first electrode 43. The hole transport layer may be formed on the first electrode 43 by inkjet printing or spin coating by using poly-2,4-ethylene-dihydroxy thiophene (PEDOT), polyaniline (PANI), or the like. At this time, examples of available organic materials may include a poly(phenylene vinylene)-based or polyfluorene-based high molecular organic material, and a color pattern may be formed by using a general method such as inkjet printing, spin coating, or thermal transfer using a laser.

The second electrode 45 may be deposited on the entire surface of the first substrate 10 to serve as a common electrode. In the display apparatus 1 according to the current embodiment, the first electrode 43 serves as an anode, and the second electrode 45 serves as a cathode, and polarities of the first and second electrodes 43 and 45 may be reversed.

If the display apparatus 1 is a bottom emission type display in which an image is displayed toward the first substrate 10, the first electrode 43 may be a transparent electrode and the second electrode 45 may be a reflective electrode. At this time, the reflective electrode may be formed by thinly depositing a metal with a low work function, for example, Ag, magnesium (Mg), Al, Pt, Pd, Au, Ni, neodymium (Nd), indium (Ir), chromium (Cr), lithium (Li), calcium (Ca), LiF/Ca, LiF/Al, or a combination thereof.

FIGS. 6A through 6D are schematic cross-sectional views sequentially showing operations of manufacturing the pad area PA in the process of manufacturing the display apparatus 1 shown in FIG. 4A.

Specifically, FIGS. 6A through 6D are cross-sectional views showing a part of a method of forming the pad area PA of the display apparatus 1 shown in FIG. 4A.

Figure 6A:
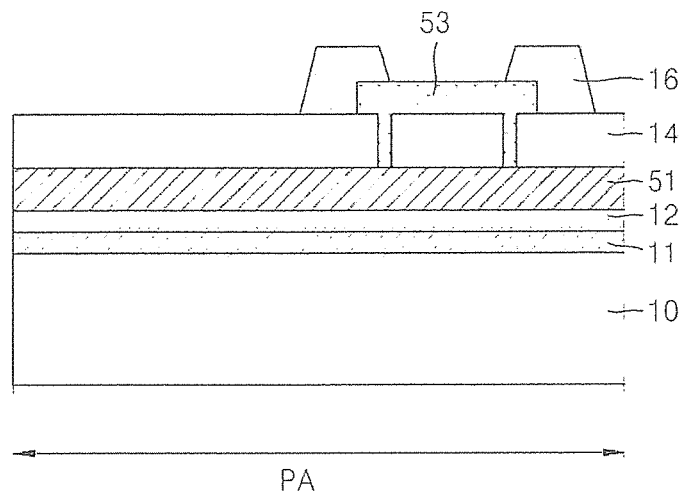
FIGS. 6A through 6D are schematic cross-sectional views sequentially showing operations of manufacturing the pad area in the process of manufacturing the display apparatus shown in FIG. 4A.

Referring to FIG. 6A, the pad area PA including the pad electrode is formed on the first substrate 10.

Figure 6B:
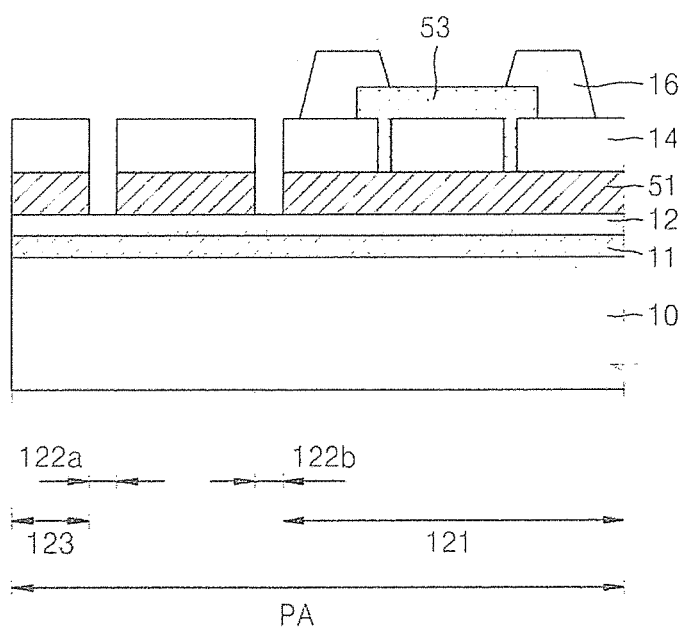

Referring to FIG. 6B, the plurality of blocking areas 122a and 122b are formed at the pad area PA so as to separate the connection area 121 and the exposed area 123 from each other. As a detailed example, the plurality of blocking areas 122a and 122b are formed in the pad area PA through a cutoff process using a laser beam. The laser beam is radiated toward the second insulating layer 14 to cutoff the second insulating layer 14 and the first pad electrode 51. The blocking areas 122a and 122b may be simultaneously formed using a plurality of laser beams. However, the present invention is not limited thereto, and the blocking areas 122a and 122b may be sequentially formed using one laser beam.

Figure 6C:
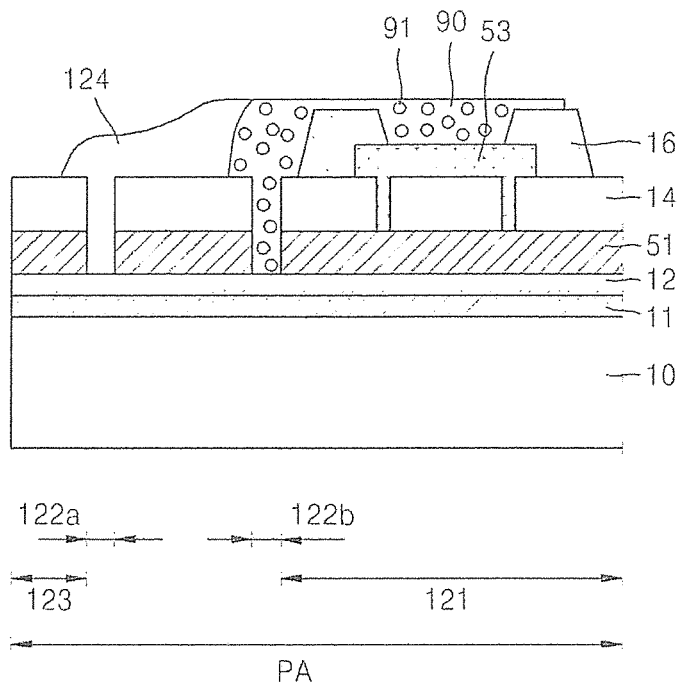

Referring to FIG. 6C, the corrosion preventer 124 may be formed in at least one of the plurality of blocking areas 122a and 122b. For example, the corrosion preventer 124 may be formed in the first blocking area 122a that is adjacent to the exposed area 123. Meanwhile, in a process of forming the corrosion preventer 124, the conductive member 90 for connecting the FPC 81 to the connection area 121 may form, for example, an ACF including the plurality of conductive balls 91. At this time, the conductive member 90 may be inserted into and located at the second blocking area 122b. However, the present invention is not limited thereto, and the corrosion preventer 124 may be formed instead of the conductive member 90.

Figure 6D:
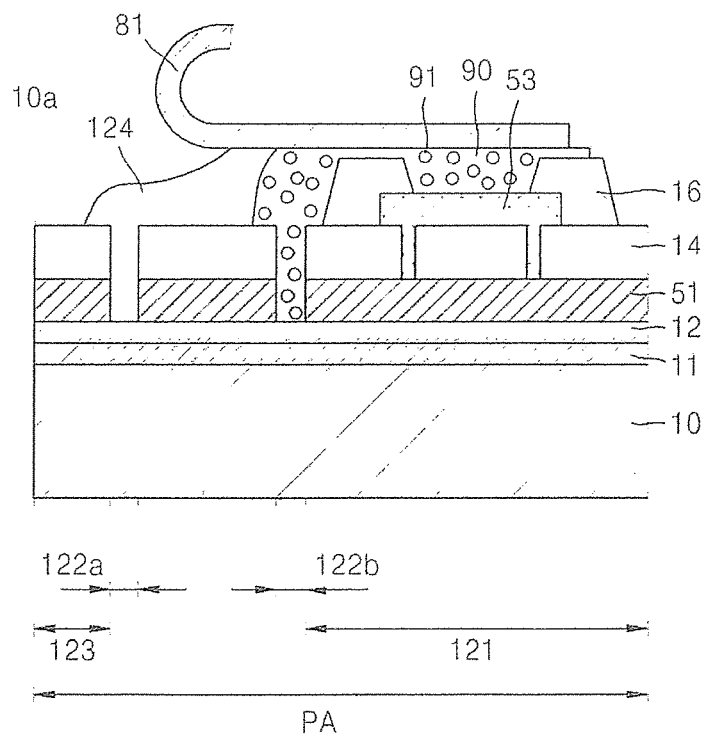

Referring to FIG. 6D, the FPC 81 is connected to the connection area 121, and the PCB 83 (see FIG. 1) is connected to the FPC 81. In addition, the FPC 81 may be bent upward, that is, in a direction away from the first substrate 10 so that the side surface of the first substrate 10 is exposed and that the FPC 81 and the PCB 83 do not cross the extension line 10a of the edge (or side surface) of the first substrate 10.

FIGS. 7A through 7D are schematic cross-sectional views sequentially showing operations of manufacturing the pad area PA in the process of manufacturing the display apparatus 1 shown in FIG. 4B.

Specifically, FIGS. 7A through 7D are cross-sectional views showing a part of a method of forming the pad area PA of display apparatus 1 shown in FIG. 4B.

Figure 7A:
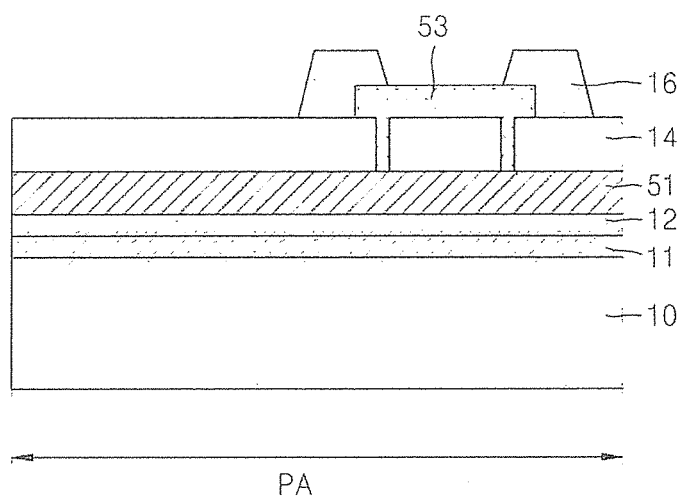
FIGS. 7A through 7D are schematic cross-sectional views sequentially showing operations of manufacturing the pad area in the process of manufacturing the display apparatus shown in FIG. 4B.

Referring to FIG. 7A, the pad area PA is formed on the first substrate 10.

Figure 7B:
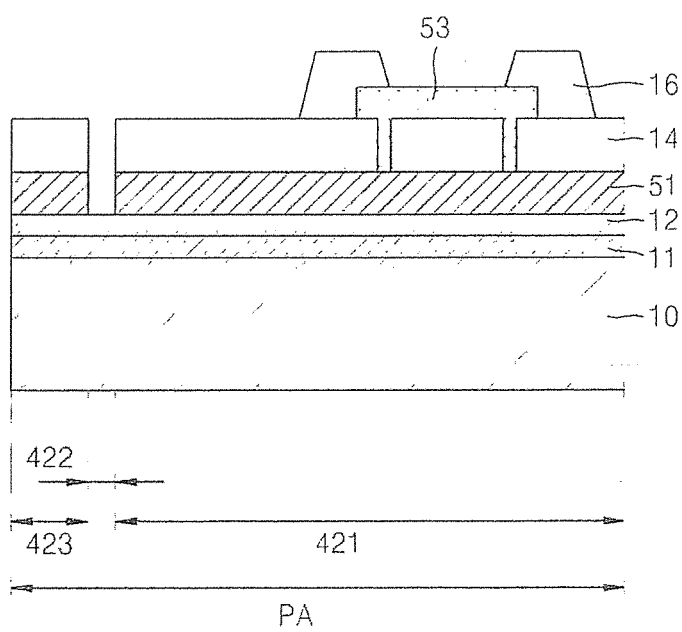

Referring to FIG. 7B, a single blocking area 422 is formed at the pad area PA so as to separate the connection area 421 and the exposed area 423 from each other. As a detailed example, a single blocking area 422 may be formed at the pad area PA through a cutoff process using a laser beam. The laser beam is radiated toward the second insulating layer 14 to cut off the second insulating layer 14 and the first pad electrode 51, thereby forming the blocking area 422.

Figure 7C:
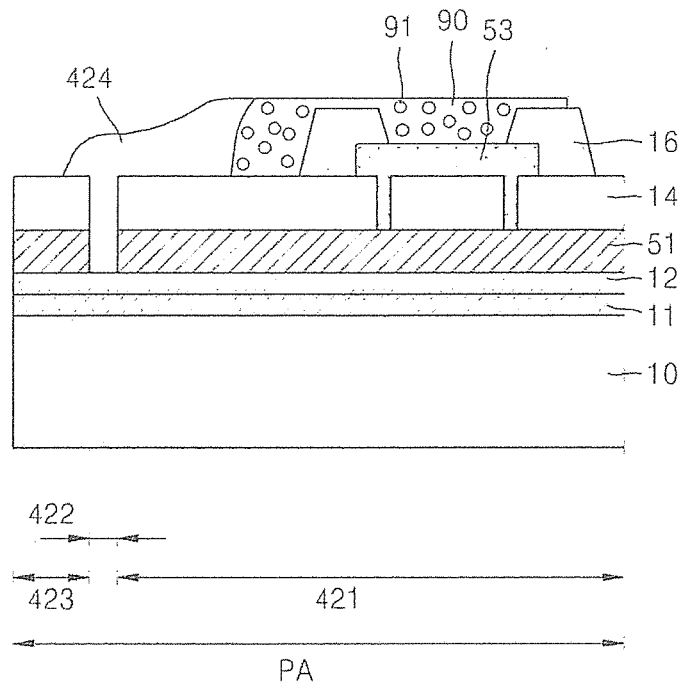

Referring to FIG. 7C, the corrosion preventer 424 may be formed inside (or within) the blocking area 422 so as to prevent moisture from entering through the blocking area 422. Meanwhile, in a process of forming the corrosion preventer 424, the conductive member 90 for connecting the FPC 81 to the connection area 421 may form, for example, an ACF including the plurality of conductive balls 91.

Figure 7D:
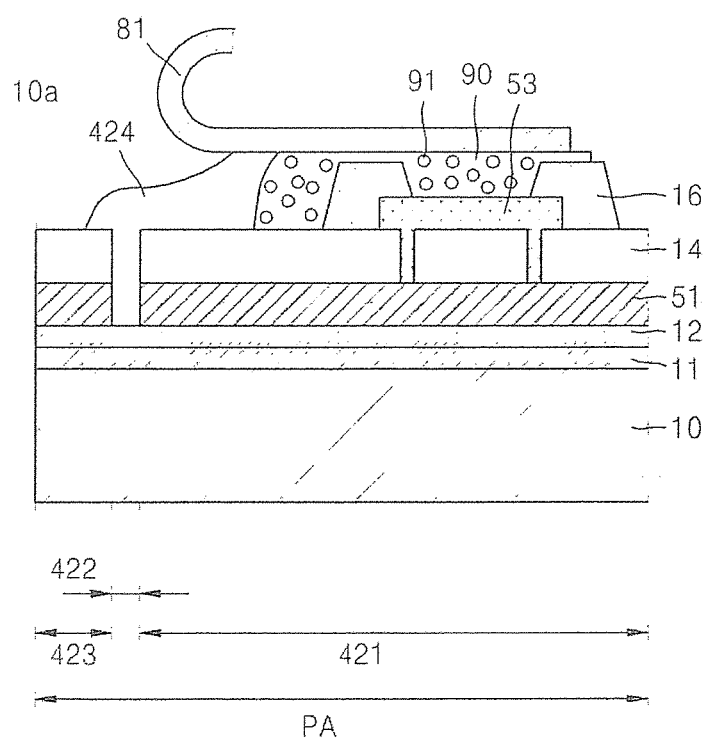

Referring to FIG. 7D, the FPC 81 may be connected to the connection area 421, and the PCB 83 (see FIG. 1) may be connected to the FPC 81. In addition, the FPC 81 is bent upward, that is, in a direction away from the first substrate 10 so that the side surface of the first substrate 10 is exposed and so that the FPC 81 and the PCB 83 do not cross the extension line 10a of the edge (or side surface) of the first substrate 10.

In the above-described embodiment, the organic light-emitting display apparatus has been described as an example. However, the present invention is not limited thereto, and any of various display devices including a liquid crystal display apparatus may be used. In addition, the drawings for describing the embodiment of the present invention show one TFT and one capacitor. However, this is just for convenience of description, and the present invention is not limited thereto. As long as a number of mask processes is not increased, a plurality of TFTs and a plurality of capacitors may be included in the display apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims and the equivalents thereof.

What is claimed is:

1. A display apparatus that comprises a first substrate comprising a display region, a non-display region, and a pad region, and a second substrate facing the first substrate and corresponding to at least the display region, wherein the pad region comprises:
   a connection region at which a driving circuit is connected to a pad electrode;
   an exposed region spaced from the connection region, the connection region being between the exposed region and the display region; and
   a plurality of blocking regions having an opening shape and being between the connection region and the exposed region,
   wherein both of the connection region and the exposed region comprise a first pad electrode,
   wherein the first pad electrode of the exposed region is externally exposed, and
   wherein the opening of the plurality of blocking regions separates the first pad electrode of the connection region and the first pad electrode of the exposed region from each other.

2. The display apparatus of claim 1, further comprising a corrosion preventer which is inside at least one of the plurality of blocking regions.

3. The display apparatus of claim 1, wherein the plurality of blocking regions comprises a first blocking region adjacent to the exposed region and a second blocking region adjacent to the connection region.

4. The display apparatus of claim 3, further comprising a corrosion preventer which is inside the first blocking region.

5. The display apparatus of claim 1, wherein the driving circuit comprises a flexible printed circuit (FPC) connected to the connection region and bent toward the second substrate.

6. The display apparatus of claim 5, wherein a top surface of a portion of the first substrate that is at the exposed region is spaced from the FPC and not covered by the FPC.

7. The display apparatus of claim 5, further comprising a printed circuit board (PCB) facing the second substrate and connected to the FPC.

8. The display apparatus of claim 7, wherein the PCB does not cross an extension line of a side surface of the first substrate.

9. The display apparatus of claim 1, wherein the connection region is farther from an edge of the first substrate than the exposed region.

10. The display apparatus of claim 1, wherein the display region comprises a first electrode, a second electrode, and an intermediate layer between the first electrode and the second electrode and comprising an organic emission layer.

11. The display apparatus of claim 10, wherein the display region further comprises a thin film transistor (TFT) electrically connected to the first electrode and comprising an active layer, a gate electrode, and source and drain electrodes.

12. The display apparatus of claim 11, wherein the connection region has a multi-layered structure comprising a plurality of layers, wherein at least one of the plurality of layers comprises a same material as the gate electrode, and at least another one of the plurality of layers comprises a same material as the source and drain electrodes.

13. A display apparatus that comprises a first substrate comprising a display region, a non-display region, and a pad region, and a second substrate facing the first substrate and corresponding to at least the display region, wherein the pad region comprises:
   a connection region at which a driving circuit unit is connected to a pad electrode;
   an exposed region spaced from the connection region, the connection region being between the exposed region and the display region;
   a single blocking region having an opening shape and being between the connection region and the exposed region; and
   a corrosion preventer which is inside the single blocking region,
   wherein both of the connection region and the exposed region comprise a first pad electrode,
   wherein the first pad electrode of the exposed region is externally exposed, and
   wherein the opening of the plurality of blocking regions separates the first pad electrode of the connection region and the first pad electrode of the exposed region from each other.

14. The display apparatus of claim 13, wherein the driving circuit comprises an FPC connected to the pad electrode at the connection region and bent away from the first substrate and toward the second substrate.

15. The display apparatus of claim 14, wherein a top surface of the exposed region is spaced from the FPC and not covered by the FPC.

16. The display apparatus of claim 14, further comprising a PCB facing the second substrate and connected to the FPC.

17. The display apparatus of claim 16, wherein the PCB does not cross an extension line of a side surface of the first substrate.

18. The display apparatus of claim 13, wherein the connection region is farther from an edge of the first substrate than the exposed region.

19. The display apparatus of claim 13, wherein the display region comprises a first electrode, a second electrode, and an intermediate layer between the first electrode and the second electrode and comprising an organic emission layer.

20. The display apparatus of claim 19, wherein the display region further comprises a TFT electrically connected to the first electrode and comprising an active layer, a gate electrode, and source and drain electrodes.

21. The display apparatus of claim 20, wherein the connection region has a multi-layered structure comprising a plurality of layers, wherein at least one of the plurality of layers comprises a same material as the gate electrode, and at least another one of the plurality of layers comprises a same material as the source and drain electrodes.

* * * * *